United States Patent [19]

Iafrate et al.

[11] Patent Number: 5,488,226

[45] Date of Patent: Jan. 30, 1996

[54] INFRARED IMAGING ARRAY BASED ON TEMPERATURE DRIVEN ANISOTROPIC OPTICAL ABSORPTION

[75] Inventors: Gerald J. Iafrate, Raleigh, N.C.; Mitra Dutta, Tinton Falls; Paul H. Shen, Howell, both of N.J.; Michael A. Stroscio, Durham, N.C.

[73] Assignee: The United States of America as represented by the Secretary of the Army, Washington, D.C.

[21] Appl. No.: 341,774

[22] Filed: Nov. 18, 1994

[51] Int. Cl.⁶ .................................................. H01L 31/06
[52] U.S. Cl. ................................ 250/338.4; 250/370.08
[58] Field of Search ........................... 250/338.4, 338.1, 250/339.14, 370.01, 370.08; 257/18, 21

[56] References Cited

U.S. PATENT DOCUMENTS

| | | | |
|---|---|---|---|
| 5,313,073 | 5/1994 | Kuroda et al. | 257/18 |
| 5,381,260 | 6/1995 | Ballato et al. | 359/248 |
| 5,387,997 | 2/1995 | Iafrate et al. | 359/248 |

OTHER PUBLICATIONS

Chen et al., "Two-Mode InGaSb/GaSb Strained-Layer Superlattice IR Photodetector" IEEE Electron Device Lett., vol. 14, No. 9, (Sep. 1993) pp. 447–449.

Shen et al., "Optical Anisotropy in GaAs/Al$_x$Ga$_{1-x}$ Multiple Quantum Wells Under Thermally Induced Uniaxial Strain", Physical Reviews B, vol. 47, pp. 993–996, May 15, 1993.

Shen et al, "Normal Incidence High Contrast Multiple Quantum Well Light Modulator Based on Polarization Rotation", Applied Physical Letters, vol. 62, No. 23, pp. 2908–2910, Jun. 7, 1993.

*Primary Examiner*—Davis L. Willis
*Assistant Examiner*—Richard Hanig
*Attorney, Agent, or Firm*—Michael Zelenka; William H. Anderson

[57] ABSTRACT

An thermal imaging device having a transparent substrate, an active multiple quantum well (MQW) epilayer with bottom electrical contacts bonded to the substrate, wherein the substrate is cut such that its thermal expansion coefficient is matched or roughly matched to that of the MQW epilayer in the direction parallel to the long axis of the bottom contacts and so that the thermal expansion coefficient of the substrate is mismatched in a direction normal to the long axis of the bottom contacts. Infrared radiation incident on each unit cell of the n×m array will produce a temperature change $\Delta T$ in the MQW which will produce stress normal to the long axis of the bottom contacts. The uniaxial stress produced by the temperature changes $\Delta T$ breaks the rotation symmetry in the plane of the MQW structure. This will result in anisotropic mixing of the heavy and light holes in the MQW epilayer and thus, will result in an anisotropic excitonic absorption of the MQW epilayer, which can be detected and analyzed either electrically or optically.

28 Claims, 2 Drawing Sheets

5,488,226

INFRARED IMAGING ARRAY BASED ON TEMPERATURE DRIVEN ANISOTROPIC OPTICAL ABSORPTION

GOVERNMENT INTEREST

The invention described herein may be made, used, sold, and/or licensed by, or on behalf of, the Government of the United States of America without the payment to us of any royalties thereon.

RELATED APPLICATIONS

The present application is related to two applications assigned to the same assignee, the United States of America, as represented by the Secretary of the Army, which are entitled, "Uniaxially Strained Semiconductor Multiple Quantum Well Device Using Direction-Dependent Thermal Expansion Co-efficients In A Host Substrate," Attorney Docket No.: CECOM-4850, Ser. No. 08/154,901, filed Nov. 19, 1993 now U.S. Pat. No. 5,381,260; and "Optically Modulator Based on Piezoelectrically Driven Anisotropic Optical Absorption," Attorney Docket No.: CECOM-4982, Ser. No. 08/159,902, filed Nov. 29, 1993 now U.S. Pat. No. 5,387,997.

FIELD OF THE INVENTION

The present invention relates in general to imagers and detectors of infrared and thermal radiation based on quantum well technology and more particularly relates to a new class of imager and detector arrays which are driven by quantum well heterostructures having an anisotropic strain placed on them.

BACKGROUND OF THE INVENTION

Semiconductor multiple quantum well (MQW) infrared and thermal radiation imaging arrays are of considerable interest to military and commercial manufacturers because of their use in night vision and satellite applications.

Prior research on arrays made of solid state infrared detectors has concentrated on devices which incorporate semiconductor quantum well superlattices which are formed on semiconductor substrates. Typically, these multiple quantum well superlattice structures are designed such that within each quantum well there is a ground electron state and several energy bands and subbands defining excited electron energy states. Accordingly, when infrared energy is incident to the device, there is intersubband absorption which excites electrons from the ground state into one of the excited states. A measurable photosignal results when the photoexcited electrons tunnel out of the wells. Unfortunately, this type of design leads to devices which cannot be tuned very easily or which are difficult to manufacture within the required tolerances. Accordingly, there is always a need for alternative classes of infrared detecting devices. The present invention provides an alternate class of such a device array.

SUMMARY OF THE INVENTION

Accordingly, it is an object of the present invention to provide for an alternative infrared and thermal imaging device.

Another object of the present invention is to combine the use of piezoelectrically induced strain on a quantum well heterostructure so as to tune the temperature induced uniaxial anisotropic absorption of infrared radiation.

These and other objects of the invention are achieved in one embodiment of the invention by providing for an array of unit cells, which are each comprised of an active multiple quantum well (MQW) epilayer with bottom electrical contacts bonded to a transparent piezoelectric substrate. The substrate is cut and the bottom contacts are bonded to the substrate such that the substrate' thermal expansion coefficient is matched or roughly matched to that of the MQW epilayer in the direction parallel to a selected reference axis, referred to as the long axis, of the bottom contacts and so that the thermal expansion coefficient is mismatched in the direction of the substrate that is normal to the selected reference axis of the bottom contacts. In order to control the bias of the MQW epilayer, a transparent contact is fabricated over the MQW epilayer. This transparent contact layer is contacted electrically with a side contact connector; the side contact connector serves as a lead and contacts only the top transparent contact and not the substrate. Each active MQW structure is also in thermal contact with a temperature stabilized heat sink via a thermal conductor connecting the MQW structure and the heat sink through a hole in the piezoelectric substrate.

Infrared radiation incident on each unit cell of the n×m array will produce a temperature change $\Delta T$ in the MQW which will produce stress normal to the long axis of the bottom contacts. The uniaxial stress produced by the temperature changes $\Delta T$ breaks the rotation symmetry in the plane of the MQW structure, thus resulting in an anisotropic mixing of heavy and light holes in the MQW structure. This anisotropic mixing, in turn, results in anisotropic excitonic absorption, which results in a bias change that can be addressed electrically with the side contact connector and the bottom contacts. Then, with conventional electrical circuitry, the electrical signals between the top and the side connectors can be analyzed to determine the amount and intensity of the infrared radiation incident to the device array.

BRIEF DESCRIPTION OF THE DRAWINGS

These and other features of the present invention will be more clearly understood in light of the following Detailed Description and the Figures wherein.

It must be noted that for purposes of illustration, the dimensions of some of the elements of the device are not drawn to scale in comparison with the other elements. However, example dimensions are provided in the Detailed Description of the Invention.

DETAILED DESCRIPTION OF THE INVENTION

Figure 1:
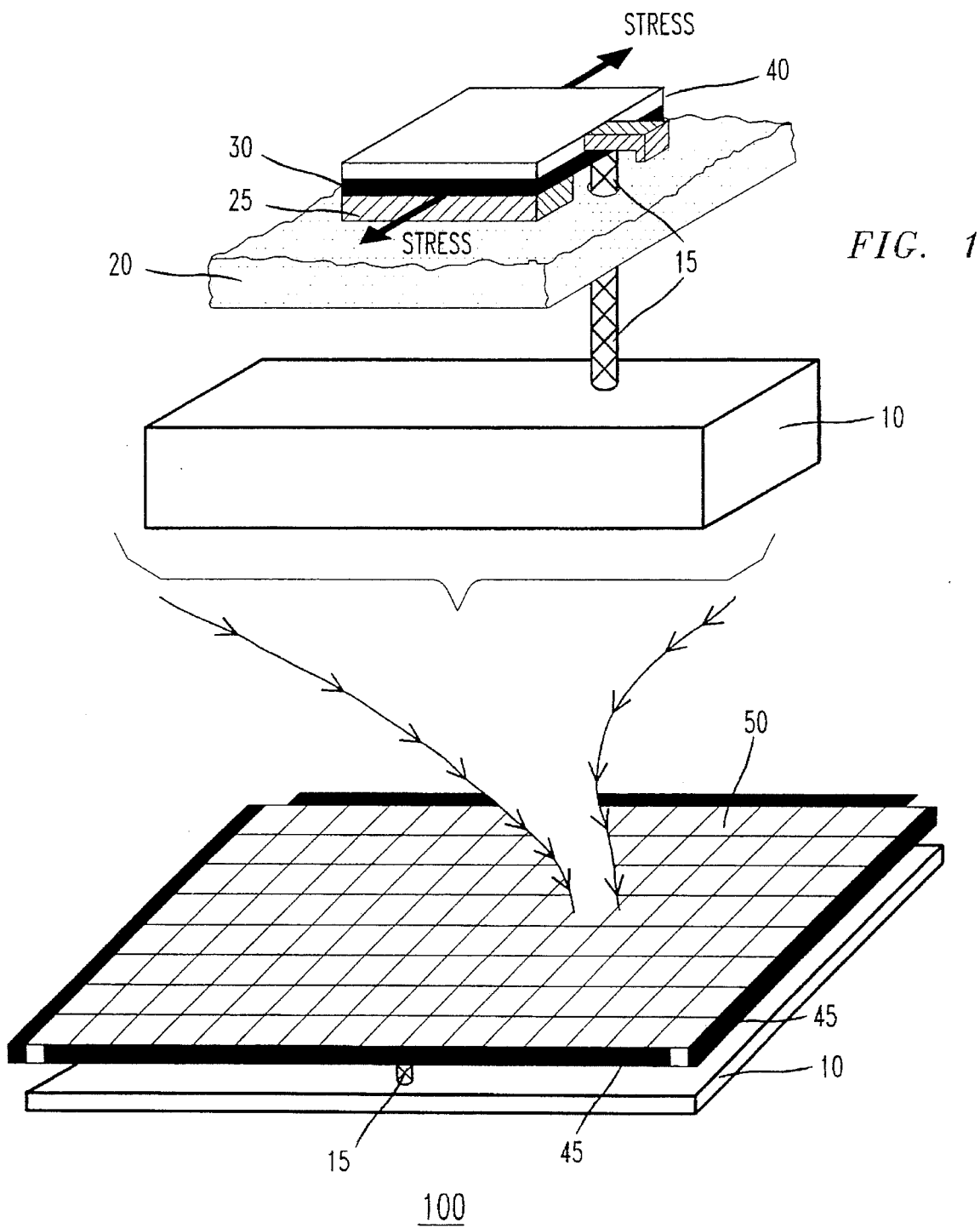
FIG. 1 is a partially exploded view of an infrared/thermal imaging array according to the present invention.
Figure 2:
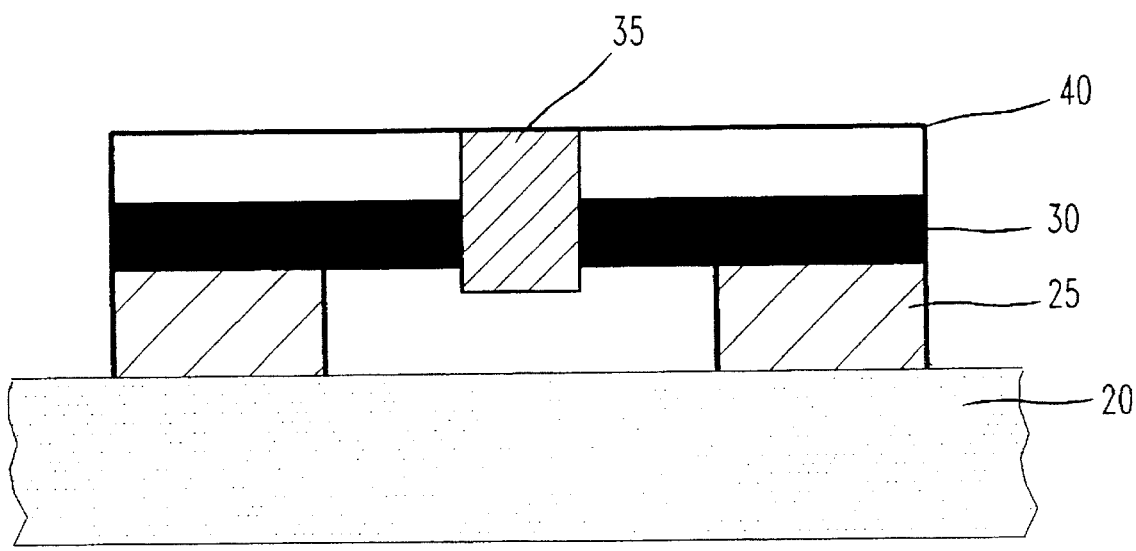
FIG. 2 is a cross-section illustration of a unit cell according to the present invention.

Now referring to the Figures, there is shown in FIG. 1 a partially exploded view of an infrared/thermal imaging array with a single unit 50 of the array shown in perspective view. As shown in FIGS. 1 and 2, a unit cell 50 is bonded to a transparent substrate 20 and comprises bottom electrical contacts 25, an active MQW epilayer 30 connected to the bottom electrical contacts 25, a transparent top electrode 40 fabricated on top of the MQW epilayer 30, and a side electrical contact 35. To obtain additional control and tunability of the device, the substrate 20 may be a piezoelectric material so that an additional strain may be induced by applying a voltage across suitable pairs of parallel electrodes 45 (FIG. 1) located on the side of the piezoelectric substrate. The substrate 20 is cut and bonded to the bottom contacts such that the substrate's thermal expansion coefficient is matched or roughly matched to that of the MQW epilayer 30 in a direction parallel to the long axis of the bottom contacts 25 and such that the thermal expansion coefficient of the substrate 20 is mismatched normal to the long axis of the bottom contacts 25. The side electrical contact 35 only contacts the transparent top electrical contact 40 and serves as a lead to electrical circuitry (not shown).

The active MQW epilayer 30 is, for example, a p-i(MQW)-n structure grown with conventional epitaxy techniques, such as molecular beam epitaxy, and processed with conventional lift-off techniques. An example, of a MQW epilayer which is suitable for the present invention is a heterostructure wherein the i region consists of approximately 100 periods of 100 Å GaAs/60 Å $Al_{0.2}Ga_{0.8}As$ multiple quantum wells.

The single units 50 can be formed in an n×m array as shown in FIG. 1 and the array can be surrounded by electrodes 45 to provide a bias on the array structure so that an additional strain can be placed on the single units 50. Each of the single units 50 are thermally coupled to a heat sink via a thermally conductive connection 15 which passes through the piezoelectric substrate 20. The electrical circuitry used to drive the present invention and to analyze the change in absorption of the device is conventional circuitry and therefore, need not be elaborated on here as those skilled in the art will readily be able to develop any suitable circuitry given this disclosure.

When infrared radiation or other source of heat is incident to each unit cell 50 of the n×m array, the radiation will produce a temperature change $\Delta T$ in the active MQW epilayer 30 which will produce stress normal to the long axis of the bottom contacts. This uniaxial stress, produced by the temperature change $\Delta T$, breaks the rotation symmetry in the plane of MQW epilayer. This results in anisotropic mixing of the heavy and light holes in the MQW epilayer and results in anisotropic excitonic absorption. The induced anisotropic absorption, then, produces a different electrical characteristic in the MQW epilayer which can be addressed electrically via the side contact connector and which can be analyzed by conventional circuitry connected to the bottom and side contact connectors.

An empirical explanation of the anisotropic absorption of energy caused by this anisotropic strain is given in articles written by the inventors herein, such as, "Optical Anisotropy in $GaAs/Al_xGa_{1-x}$ Multiple Quantum Wells Under Thermally Induced Uniaxial Strain," by Shen et al, *Physical Reviews B,* Vol. 47, pg 993–996, May 15, 1993 and "Normal Incidence High Contrast Multiple Quantum Well Light Modulator Based on Polarization Rotation," by Shen et al, *Applied Physical Letters,* Vol. 62, no. 23, pgs 2908–2910, Jun. 7, 1993. Further information concerning the effects of uniaxial straining of MQW epilayers can be found in the related applications listed at the beginning of this specification. All of these references are incorporated herein by reference.

The temperature induced strain, described above, may be augmented by a piezoelectrically induced strain which can be produced by applying a voltage across suitable pairs of parallel electrodes 45 (FIG. 1) located on the sides of the piezoelectric substrate. The piezoelectric nature of the substrate can then be used to tune the uniaxial strain and provide a novel means of influencing the response of the n×m array.

Of course, given the present disclosure, those skilled in the art would be readily able to modify the elements of the present invention to arrive at any number of configurations. Accordingly, the inventors do not wish to be limited by the present description, but only by the appended claims.

For example, an additional embodiment is provided by thermally contacting each unit cell to a grid-like heat sink structure which would be comprised of two orthogonal parallel arrays of temperature stabilized material with wire like geometries. In this embodiment, each wire like element of the heat sink array would run along one of the lines defined by n×m grid of the array. Further, an additional embodiment would include optically addressing each unit cell of the imaging array with an optical fiber which would be placed just below a transparent substrate. As those skilled in the art would realize the anisotropic absorption created by the uniaxial strain, and explained in the articles mentioned above, would alter an optic signal incident to the array. Accordingly, this signal change could also be analyzed in the manner similar to that of an electric signal.

What is claimed is:

1. A thermal imaging device comprising:
   a substrate having an anisotropic thermal expansion coefficient;
   bottom contact means bonded to the substrate, said bottom contact means having a lengthwise axis;
   a multiple quantum well epilayer displaced on the bottom contacts, said multiple quantum well epilayer having a thermal expansion coefficient; and
   means to electrically contact the multiple quantum well epilayer without contacting the substrate;
   wherein the substrate is formed such that thermal expansion coefficient of the substrate is matched to that of the MQW epilayer in the direction parallel to the lengthwise axis of the bottom contact means and so that the thermal expansion coefficient of the substrate normal to the lengthwise axis of the bottom contact means is not matched, and wherein when thermal radiation is incident to the multiple quantum well epilayer, an anisotropic strain is displaced along the multiple quantum well epilayer due to the difference of the thermal expansion coefficients of the multiple quantum well epilayer and the substrate whereby an anisotropic absorption is induced in said multiple quantum well epilayer by the uniaxial strain.

2. The thermal imaging device of claim 1 wherein the bottom contact means comprises at least two conductive contacts.

3. The thermal imaging device of claim 2 wherein the multiple quantum well epilayer is a p-i-n semiconductor epilayer wherein the i layer includes a multiple quantum well.

4. The thermal imaging device of claim 3 wherein the i layer includes 100 periods of 100 Å GaAs/60 Å $Al_{0.2}Ga_{0.8}As$ multiple quantum wells.

5. The thermal imaging device of claim 2 wherein the means to electrically contact the multiple quantum well epilayer comprises transparent top contact means disposed on the multiple quantum well epilayer and side electrical contact means disposed on a side of the transparent top contact means.

6. The thermal imaging device of claim 1 wherein a plurality of multiple quantum well epilayers are disposed on the substrate in a predetermined pattern.

7. The thermal imaging device of claim 1 further comprising means to thermally stabilize the multiple quantum well epilayer.

8. The thermal imaging device of claim 7 wherein the thermal stabilizing means comprises a heat sink which is thermally connected to the multiple quantum well epilayer.

9. The thermal imaging device of claim 8 wherein the heat sink is thermally coupled to the multiple quantum well epilayer through holes in the substrate.

10. The thermal imaging device of claim 9 wherein the heat sink is thermally coupled to the multiple quantum well epilayer via thermally conductive wires that are channelled over the substrate in a determined manner.

11. The thermal imaging device of claim 1 wherein a change in an electrical signal induced by the anisotropic absorption of the multiple quantum well epilayer is analyzed.

12. The thermal imaging device of claim 1 wherein a change in an optical signal induced by the anisotropic absorption of the multiple quantum well epilayer is analyzed.

13. The thermal imaging device of claim 8 wherein the heat sink is a grid structure comprised of two orthogonal parallel arrays.

14. The thermal imaging device of claim 6 wherein each of the plurality of multiple quantum well epilayers is optically coupled to an optical fiber.

15. A thermal imaging device comprising:
   a piezoelectric substrate having an anisotropic thermal expansion coefficient and having electrodes on lateral sides on the piezoelectric substrate;
   bottom contact means bonded to the piezoelectric substrate, said bottom contact means having a lengthwise axis;
   a multiple quantum well epilayer displaced on the bottom contacts, said multiple quantum well epilayer having a thermal expansion coefficient; and
   means to electrically contact the multiple quantum well epilayer without contacting the piezoelectric substrate;
   wherein the piezoelectric substrate is formed such that thermal expansion coefficient of the piezoelectric substrate is matched to that of the MQW epilayer in the direction parallel to the lengthwise axis of the bottom contact means and so that the thermal expansion coefficient of the substrate normal to the lengthwise axis of the bottom contact means is not matched, and wherein when thermal radiation is incident to the multiple quantum well epilayer, an anisotropic strain is displaced along the multiple quantum well epilayer due to the difference of the thermal expansion coefficients of the multiple quantum well epilayer and the substrate whereby an anisotropic absorption is induced in said multiple quantum well epilayer by the uniaxial strain wherein the piezoelectric substrate is biased by electrodes that are attached along sides of the substrate.

16. The thermal imaging device of claim 15 wherein the bottom contact means comprises at least two conductive contacts.

17. The thermal imaging device of claim 16 wherein the multiple quantum well epilayer is a p-i-n semiconductor epilayer wherein the i layer includes a multiple quantum well.

18. The thermal imaging device of claim 17 wherein the i layer includes 100 periods of 100 Å GaAs/60 Å $Al_{0.2}Ga_{0.8}As$ multiple quantum wells.

19. The thermal imaging device of claim 16 wherein the means to electrically contact the multiple quantum well epilayer comprises transparent top contact means disposed on the multiple quantum well epilayer and side electrical contact means disposed on a side of the transparent top contact means.

20. The thermal imaging device of claim 15 wherein a plurality of multiple quantum well epilayers are disposed on the substrate in a predetermined pattern.

21. The thermal imaging device of claim 15 further comprising means to thermally stabilize the multiple quantum well epilayer.

22. The thermal imaging device of claim 21 wherein the thermal stabilizing means comprises a heat sink which is thermally connected to the multiple quantum well epilayer.

23. The thermal imaging device of claim 22 wherein the heat sink is thermally coupled to the multiple quantum well epilayer through holes in the substrate.

24. The thermal imaging device of claim 23 wherein the heat sink is thermally coupled to the multiple quantum well epilayer via thermally conductive wires that are channelled over the substrate in a determined manner.

25. The thermal imaging device of claim 15 wherein a change in an electrical signal induced by the anisotropic absorption of the multiple quantum well epilayer is analyzed.

26. The thermal imaging device of claim 15 wherein a change in an optical signal induced by the anisotropic absorption of the multiple quantum well epilayer is analyzed.

27. The thermal imaging device of claim 21 wherein the heat sink is a grid structure comprised of two orthogonal parallel arrays.

28. The thermal imaging device of claim 20 wherein each of the plurality of multiple quantum well epilayers is optically coupled to an optical fiber.

* * * * *